March 19, 1968 C. R. CALLIS 3,374,361

ZENER COUPLED WIDE BAND LOGARITHMIC VIDEO AMPLIFIER

Filed Sept. 4, 1964

INVENTOR.
Carl R. Callis,
BY
H. H. Locke
Att'ys.

United States Patent Office 3,374,361

Patented Mar. 19, 1968

3,374,361

ZENER COUPLED WIDE BAND LOGARITHMIC VIDEO AMPLIFIER

Carl R. Callis, Glen Burnie, Md., assignor, by mesne assignments, to the United States of America as represented by the Secretary of the Navy

Filed Sept. 4, 1964, Ser. No. 394,641
4 Claims. (Cl. 307—229)

ABSTRACT OF THE DISCLOSURE

A Zener coupled wide band logarithmic video amplifier having a transistor amplifier coupled to an emitter follower transistor amplifier by a Zener diode for direct current signal coupling with a first feedback through a resistor from the collector to the base of the first transistor and a second feedback from the emitter follower output to the base of the first transistor. Temperature compensating diodes are coupled to each transistor to produce good logarithmic characteristics over a wide band.

*Background of the invention*

This invention relates to logarithmic amplifiers and more particularly to a transistor amplifier and an emitter follower transistor amplifier coupled by a Zener diode in a voltage supply and bias circuit with the emitter follower driving the second feedback loop and with diode temperature compensation to provide an amplifier with a good logarithmic characteristic gain curve over a wide band of frequencies.

Various circuit arrangements have been employed in the prior art to provide logarithmic characteristics in amplifier circuits including transistor amplifiers. The logarithmic characteristics have been improved by cascading several logarithmic amplifier stages to smooth out the log curve of amplifier gain. Each logarithmic amplifier stage usually has feedback paths which include a diode that must be reversed biased at some predetermined voltage to obtain the proper breakdown point on the linear amplifier gain curve. This normally required alternating current (A.C.) coupling in the feedback path thereby limiting the low frequency response. Also, the capacitors used in these A.C. feedback loops would charge up at high duty cycles and change the diode breakpoint voltage. Another thing that would change the logarithmic characteristics of the amplifier is the change in temperature affecting the transistor and diode operating points.

*Summary of the invention*

In this invention a logarithmic amplifier is produced by using a pair of transistors coupled by a Zener diode, the first transistor of which operates as an amplifier and the second transistor of which operates as an emitter follower. A first feedback is through a resistor from the collector to the base of the first transistor amplifier and a second feedback couples the emitter follower output of the second transistor to the base of the first transistor through a diode and a resistance. An adjustable voltage is coupled to the second feedback to control the direct current (D.C.) voltage level of the emitter follower transistor amplifier and the breakdown point of the diode in the second feedback circuit. The diode in the second feedback circuit together with the emitter follower transistor produce temperature compensation in that temperature affects the transistor and diode inversely to maintain stable gain control characteristics of the emitter follower transistor. A diode is coupled to the emitter of the first transistor for temperature compensation to maintain the base and emitter voltages thereof substantially at a constant D.C. level. The Zener diode maintains a constant D.C. voltage drop between the collector of the first transistor amplifier and the base of the emitter follower transistor amplifier irrespective of temperature changes since the Zener diode is of such low voltage that it has a very low temperature coefficient. Accordingly, the D.C. coupling of the transistors avoids the possibility of any capacitive reactance which might change the diode breakdown point of the transistors as a result of high duty cycles. Accordingly, it is a general object of this invention to provide a logarithmic amplifier stage with two feedback paths utilizing a pair of Zener diode-coupled transistor amplifiers, the second transistor amplifier being an emitter follower used for driving the second feedback circuit having a diode temperature compensating means therein to provide a logarithmic gain relation unaffected by temperature or high duty cycle frequency voltage signals.

*Brief description of the drawings*

These and other objects and the attendant advantages, features, and uses will become more apparent to those skilled in the art as a more detailed description proceeds when considered along with the accompanying drawings, in which.

*Description of the preferred embodiment*

Figure 1:
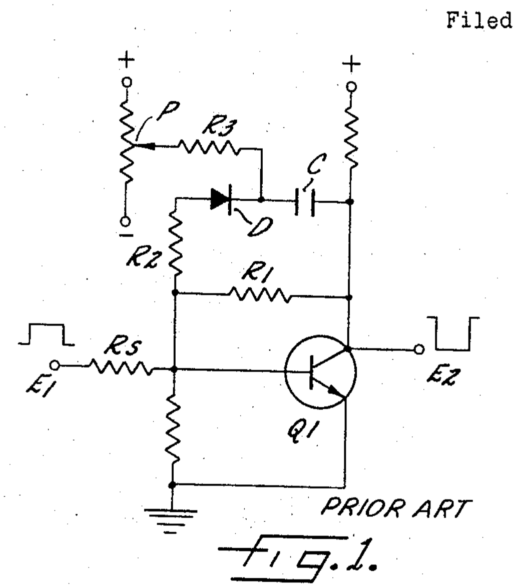
PRIOR ART FIG. 1.
FIGURE 1 is a circuit schematic illustrating a single stage of a linear-logarithmic amplifier of typical construction.

Referring more particularly to FIGURE 1, a single stage of a lin-log amplifier shows a transistor Q1 having an input signal voltage, E1, applied through a resistor $R_s$ to the base of the transistor with an output, E2, taken from the collector of this transistor. A first feedback path is through a resistor R1 to the base of transistor Q1 and a second feedback path is through a capacitor C, through a diode D, and through a resistor R2 to the base of transistor Q1. The breakdown voltage of the diode D is established from a potentiometer P through a resistor R3.

Figure 2:
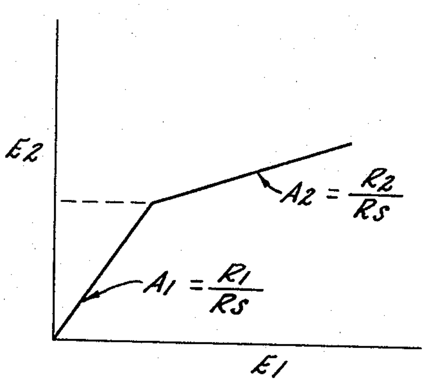
FIGURE 2 is a graph of the linear logarithmic curve of the circuit of FIGURE 1.
Figure 3:
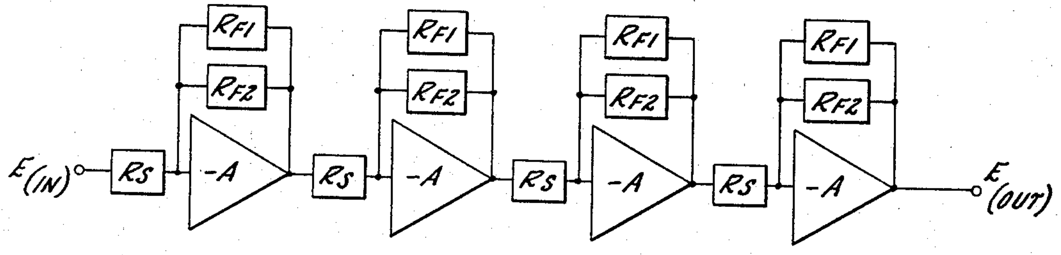
FIGURE 3 illustrates the means of cascading several stages of lin-log amplifiers.

The results of such a lin-log amplifier shown in FIGURE 1 are shown by graph in FIGURE 2 in which the logarithmic function is developed with respect to the input and output voltages E1 and E2. The gain A1 of the circuit shown in FIGURE 1 is approximately $R1/RS$ until the output voltage E2 becomes equal to the voltage on the anode of diode D or $E_a$ plus the voltage drop across diode D, or $E_d$ ($E2=E_a+E_d$). This is the portion of the linear gain shown in FIGURE 2. When breakdown of the diode D occurs, the second linear portion in FIGURE 2 will be the gain $A2=R2/RS$. By making $A2=1$ and cascading several stages, as shown in FIGURE 3, a straight line approximation to a log curve can be achieved. As illustrated in FIGURE 1, the diode D must be reverse biased at some predetermined voltage to obtain the proper breakdown point. This normally requires an A.C. coupling such as the capacitor C in the second feedback path hence limiting the low frequency response. At high duty cycles the capacitor C charges up and changes the diode breakdown voltage point disturbing the logarithmic characteristics of the amplifier. Also, temperature changes on the transistor Q1 and the diode D will change the diode breakdown points and likewise will change the logarithmic characteristics of the amplifier.

Figure 4:
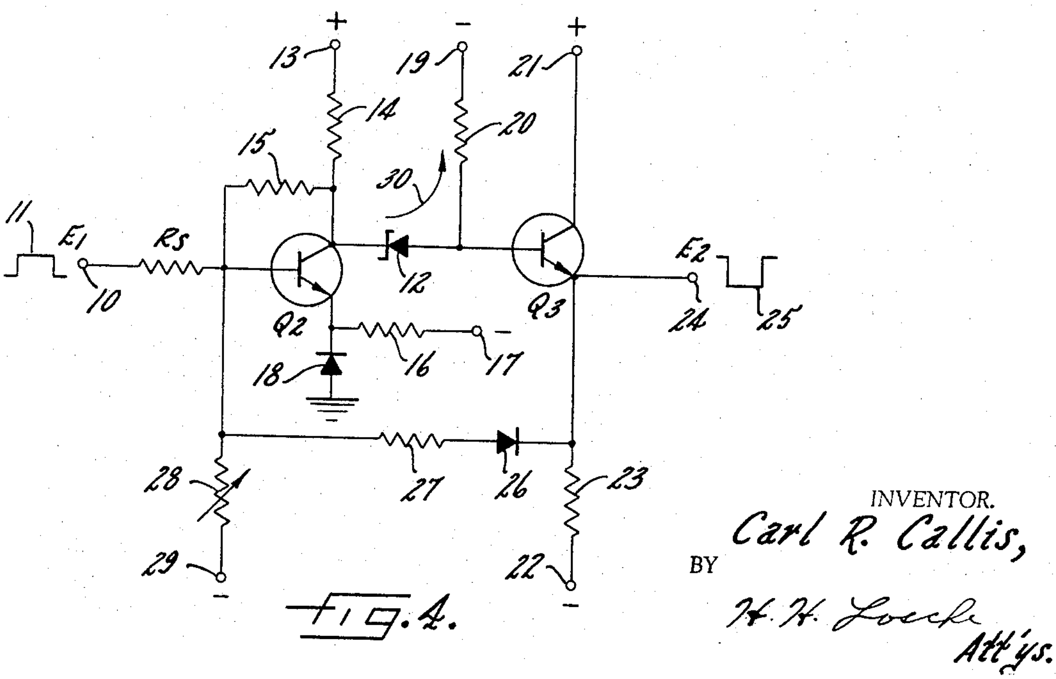
FIGURE 4 illustrates in circuit schematic a wide band logarithmic video amplifier in accordance with this invention.

Referring more particularly to FIGURE 4 of the drawing, two transistors Q2 and Q3 are coupled to produce a stage of amplification. The first transistor Q2 has its base coupled to an input terminal 10 through a resistance $R_s$ to which terminal 10 are applied voltage signals E1, as shown by the waveform 11. The collector of transistor Q2 is coupled to the cathode of a Zener diode 12, the anode of which is coupled to the base terminal of transistor Q3. The collector is supplied collector voltage from a positive D.C. source connected to terminal 13 through a collector load resistor 14. This collector is also coupled through a resistor 15 to the base of transistor Q2 providing a first feedback path. The emitter of transistor Q2 is coupled through an emitter load resistor 16 to a negative voltage source at terminal 17. The emitter of transistor Q2 is also coupled to the cathode of a temperature compensating diode 18, the anode of which is coupled to a fixed voltage source, such as ground. The base of transistor Q3 is biased from a negative voltage source 19 through a resistor 20 while the collector of this transistor is directly coupled to a positive voltage source at 21. The emitter of transistor Q3 is coupled to a negative voltage source 22 through an emitter load resistor 23. The emitter of transistor Q3 is also coupled to an output terminal 24 to produce the amplifier output signals E2, as shown by the waveform 25. The transistor Q3 operates as an emitter follower amplifier, the emitter of which also drives a second feedback circuit to the base of transistor Q2 through a diode 26 and a resistor 27 in series. The cathode of diode 26 is coupled directly to the emitter of transistor Q3 and the anode of this diode is coupled in series through the resistor 27. The base of transistor Q2 is connected with one terminal of a variable resistance 28, the opposite terminal of which is coupled to a negative voltage at 29 for providing adjustment to raise or lower the break point voltage of the diode 26 and of the emitter follower D.C. level of the transistor Q3.

The diode 18 compensates for temperature changes occurring in the semiconductor material of transistor Q2. For example, as the temperature increases the junction diode of the collector and emitter of transistor Q2 would normally cause an increase of current flow attempting to lower the emitter electrode potential. This attempt to lower the emitter voltage will cause greater current to flow through the diode 18 to maintain the emitter voltage constant. The base emitter junction will likewise be maintained at a constant D.C. differential thereby compensating for any temperature changes which would ordinarily change the conductivity of transistor Q2. The Zener diode 12, being oriented as shown, is chosen to be about five volts so that the collector voltage of Q2 remains substantially five volts above the base voltage of transistor Q3. This is accomplished by relation of resistors 14 and 20 to maintain a current flow from the positive voltage source at 13, through the resistor 14, Zener diode 12, and resistor 20 to the negative voltage source 19, as shown by the arrow 30. Such a Zener diode 12 has a very low temperature coefficient which is less than 1 microvolt per degree centigrade and change in conductivity by reason of temperature change is substantially negligible. The diode 26 is oriented as shown to compensate for temperature changes attempting to change the conductivity of transistor Q3. As the base-to-emitter voltage of transistor Q3 decreases with increasing temperature, the reverse bias of the feedback diode 26 increases to compensate for the lower breakdown voltage caused by the increase in temperature. The transistor Q3 collector-emitter current will increase with increasing temperature tending to increase the potential of the emitter. This attempted increase of the emitter potential in the positive direction would tend to back bias the diode 26, but since the diode 26 is subject to the same temperature, its breakdown voltage is lowered so that the emitter voltage of transistor Q3 is maintained constant. The emitter voltage of transistor Q3 can be raised or lowered by adjustment of the variable resistor 28. Accordingly, the only voltage changes resulting from temperature changes produce small variations in the Zener diode 12 and in the residual voltages between the transistor-diode pairs, but these voltage changes can be kept small by using the same semiconductor materials for both transistors Q2 and Q3.

*Operation*

In the operation of this device, let it be assumed that transistors Q2 and Q3 are biased and supplied by positive and negative voltages as shown in FIGURE 4 so that transistors Q2 and Q3 are in conductive states and so that current, as shown by the arrow 30, is flowing through the Zener diode 12 to maintain the constant collector-base voltage relationship in the D.C. state of the logarithmic stage of amplification. Any temperature changes, such as a raise in temperature to produce an increase in collector-emitter current flow, will be compensated by diode 18 for the transistor Q2 and by diode 26 for the transistor Q3. Falling temperatures of the solid state junction material in transistors Q2 and Q3 will be compensated in reverse order by diodes 18 and 26. Under these conditions of change in temperature, the emitter-to-base coupling to transistors Q2 and Q3 through the Zener diode 12 will remain substantially unchanged.

Upon the application of voltage signals, such as E1 shown by the waveform 11 to be amplified as the voltage signals E2, illustrated by the waveform 25, the logarithmic amplification of signals will be accomplished without any change in the logarithmic characteristics by virtue of either ambient temperature changes or temperature changes in the semiconductor junction material. If the input signals E1 to be amplified are of high duty cycle, the logarithmic characteristics of gain will remain unchanged, since the signal coupling between transistors Q2 and Q3 is a D.C. coupling through the Zener diode 12 eliminating all capacitive reactance which would normally change the logarithmic gain control of the circuit. The D.C. Zener diode 12 coupling, in the absence of any A.C. coupling elements, insures wide band operation. The output impedance of the emitter follower transistor amplifier Q3 is low and constant, independent of the feedback amplifier, which reduces gain variations when cascading stages are used, as shown in FIGURE 3. Also, since the transistor amplifier Q2 is driving a high impedance emitter follower amplifier Q3, the open loop gain is very high. This makes the amplifier gain with feedback less affected by the beta variations of the transistor in which beta represents the temperature coefficient of the energy gap.

While many modifications and changes may be made in the constructional details and features of this invention without departing from the spirit of the invention as illustrated in one embodiment as shown in FIGURE 4, it is to be understood that I desire to be limited in the scope of my invention only by the scope of the appended claims.

I claim:

1. A Zener coupled wide band logarithmic amplifier comprising:

first and second transistors, each having base, collector, and emitter electrodes with supply and bias voltages applied thereto and having the base electrode of said first transistor coupled to an input and the emitter electrode of said second transistor coupled to an output;

a Zener diode having a cathode coupled to the collector electrode of said first transistor and an anode coupled to the base electrode of said second transistor to couple said first and second transistors;

a first feedback through a resistor from the collector electrode to the base electrode of said first transistor;

a second feedback from the output to the input including a diode;

a variable voltage coupled to said second feedback to vary the conduction point of said second feedback diode; and a diode having a cathode coupled to the emitter electrode of said first transistor and an anode coupled to zero potential to compensate for temperature changes of said first transistor whereby the gain of said coupled first and second transistors is logarithmic over a wide frequency band.

2. A Zener coupled wide band logarithmic amplifier as set forth in claim 1 wherein said supply and bias voltages include a voltage coupled through a resistor to the base of said second transistor to maintain a constant direct current Zener voltage between the collector and base electrodes of said first and second transistors, respectively.

3. A Zener coupled wide band logarithmic amplifier as set forth in claim 2 wherein said first and second transistors are of the NPN type in which the first transistor operates as an amplifier and the second transistor operates as a cathode follower.

4. A Zener coupled wide band logarithmic amplifier as set forth in claim 3 wherein said input is through a resistor and said second feedback includes a resistor in series with said diode.

References Cited

UNITED STATES PATENTS

| | | | |
|---|---|---|---|
| 3,089,968 | 5/1963 | Dunn | 328—145 X |
| 3,108,197 | 10/1963 | Levin | 307—88.5 |
| 3,252,007 | 5/1966 | Saari | 307—88.5 |

JOHN S. HEYMAN, *Primary Examiner.*

ARTHUR GAUSS, *Examiner.*